United States Patent
Nam

(10) Patent No.: US 6,310,823 B1
(45) Date of Patent: Oct. 30, 2001

(54) CIRCUIT FOR GENERATING INTERNAL COLUMN STROBE SIGNAL IN SYNCHRONOUS SEMICONDUCTOR MEMORY DEVICE

(75) Inventor: Young June Nam, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/607,204

(22) Filed: Jun. 28, 2000

(30) Foreign Application Priority Data

Jun. 29, 1999 (KR) .................................. 99-25365

(51) Int. Cl.[7] ...................................... G11C 8/00
(52) U.S. Cl. .................... 365/233; 365/193; 365/230.06
(58) Field of Search .................... 365/233, 193, 365/230.06, 194, 230.08, 189.05

(56) References Cited

U.S. PATENT DOCUMENTS

| | | |
|---|---|---|
| 5,347,491 | 9/1994 | Kagami . |
| 5,555,526 * | 9/1996 | Kim ..................................... 365/203 |
| 5,619,457 | 4/1997 | Hayakawa et al. . |
| 5,781,500 * | 7/1998 | Oh ......................................... 365/233 |
| 5,959,900 * | 9/1999 | Matsubara ....................... 365/189.05 |
| 6,151,270 * | 11/2000 | Jeong .................................. 365/233 |

FOREIGN PATENT DOCUMENTS 11297969    10/1999   (JP) .

\* cited by examiner

Primary Examiner—David Nelms
Assistant Examiner—Gene N. Auduong
(74) Attorney, Agent, or Firm—Pillsbury Winthrop LLP

(57) ABSTRACT

A synchronous semiconductor memory device, comprising: burst signal generation means for generating a burst signal for controlling generation of an internal column strobe signal; burst generation control means for controlling generation of the burst signal; burst length stop signal generation means for generating a burst length stop signal for controlling a length of the burst signal to the burst signal generation means; and internal column strobe generation means for directly receiving output signals of a buffer command which are not decoded to generate an interrupt in the middle of the burst signal and generating the internal column strobe signal by the burst signal.

6 Claims, 11 Drawing Sheets

FIG.5
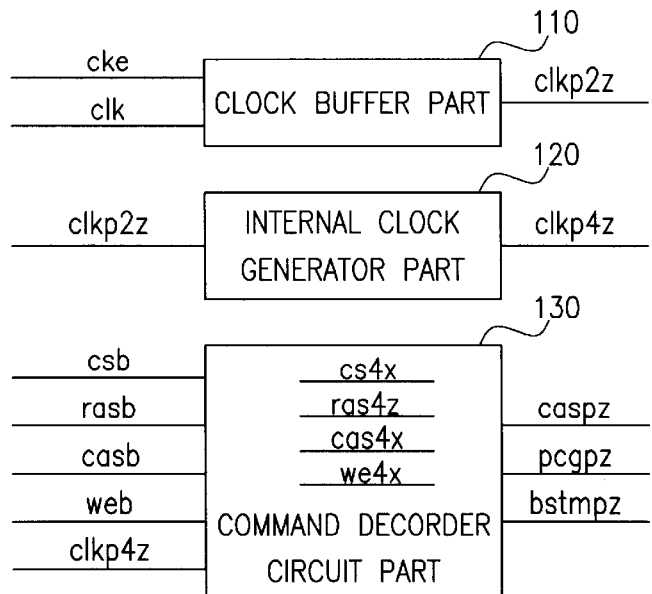
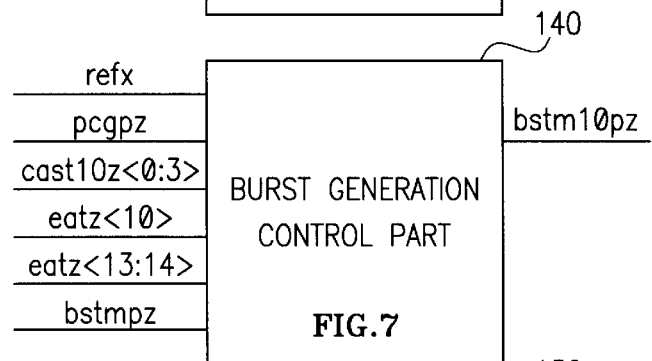
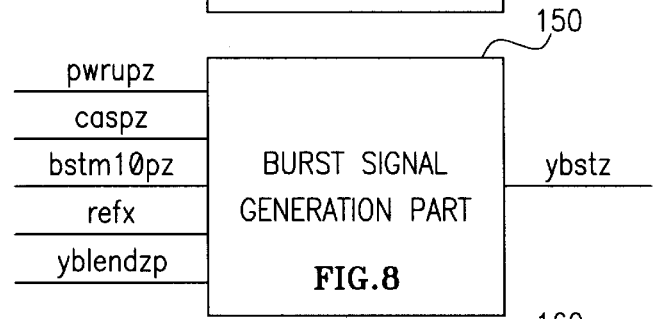
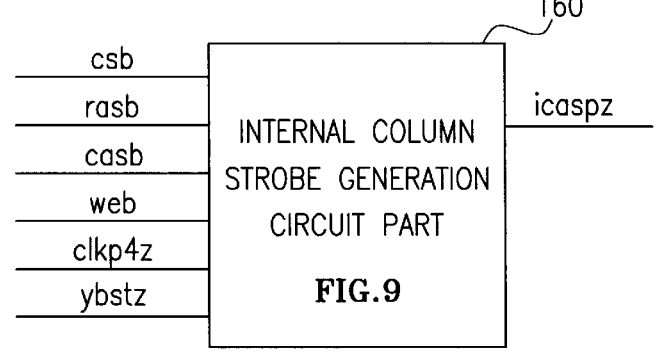

CIRCUIT FOR GENERATING INTERNAL COLUMN STROBE SIGNAL IN SYNCHRONOUS SEMICONDUCTOR MEMORY DEVICE

BACKGROUND OF THE INVENTION

1. Field of the Invention

This invention relates to a synchronous semiconductor memory device, and more particularly to a synchronous semiconductor memory device for accurately interrupting an internal column strobe signal corresponding to an input command in a high and a low frequencies, when interrupt commands such as read and burst stop commands are received in the middle of a burst length set in a mode set register MRS in operation of the synchronous semiconductor memory device.

2. Description of the Related Art

FIG. 1 shows a block diagram of a synchronous semiconductor memory device which generates an internal column strobe signal in the prior art. The synchronous semiconductor memory device includes a clock buffer circuit 10, an internal clock generation circuit 20, a command decoder circuit 30, a burst generation control circuit 40, a burst signal generation circuit 50 and an internal column strobe generation circuit 60. The clock buffer circuit 10 receives a clock enable signal cke and an external clock signal clk to generate an internal clock signal clkp2z. The internal clock generation circuit 20 receives the internal clock signal clkp2z generated from the clock buffer circuit 10 to generate another internal clock signal clkp4z.

The command decoder circuit 30 receives the internal clock signal clkp4z from the internal clock generation circuit 20 and external column strobe signals such as a chip select bar signal csb, a RAS (Row Address Strobe) bar signal rasb, a CAS (Column Address Strobe) bar signal casb, and a write enable bar signal web to generate internal command signals caspz, pcgpz and bstmpz.

The burst generation control circuit 40 receives input signals refx, cast10z<0:3>, eatz<10> and eatz<13:14> and the internal command signals pcgpz and bstmpz from the command decoder circuit 30 to generate a burst generation control signal bstm10pz. Herein, the input signal refx is a signal which is in a low state, only when the synchronous DRAM (SDRAM) is a refresh mode.

The burst signal generation circuit 50 receives a power-up signal pwrupz, the internal command signal caspz, the burst generation control signal bstm10pz, the input signal refx and a burst length stop signal yblendzp to generate a burst signal ybstz. Herein, the burst length stop signal yblendzp becomes disabled in a low state, when the burst length is stopped.

The internal column strobe generation circuit 60 receives the internal clock signal clkp4z and the burst signal ybstz to generate an internal column strobe signal icaspz. FIG. 2 is a circuit diagram of the internal column strobe generation circuit 60. As shown in FIG. 2, the internal column strobe generation circuit 60 includes a NAND gate ND1 for receiving the internal clock signal clkp4z and the burst signal ybstz, inverters IN1 and IV2 connected in series between an output of the NAND gate ND1 and a node Nd1, inverters IV3 and IV4 connected in series between the node Nd1 and a node Nd2, a NAND gate ND2 for receiving output signals of the inverters IN2 and IV4 at the nodes Nd1 and Nd2 and inverters IN5 and IV6 connected in series to an output of the NAND gate ND2 and for generating the internal column strobe signal icasp6z.

The operation of the internal strobe generation circuit 60 will be described with reference to the timing diagram of FIG. 3. First, the internal clock signal clkp4z of high state is generated with synchronization to the external clock signal clk, the command decoder circuit 30 receives the external command signals csb, rasb, casb, web) and the internal clock signal clkp4z and generates the external column strobe signal caspz by the internal clock signal clkp4z. After the external column strobe signal caspz is enabled, the burst signal generation circuit 50 which receives the external column strobe signal caspz generates the burst signal ybstz of high state.

The internal column strobe generation circuit 60 which receives the burst signal ybstz and the internal clock signal clkp4z generates the internal column strobe signal icasp6z with synchronization to the internal clock signal clkp4z during the enable interval of the burst signal ybstz, i.e. the high state of the burst signal ybstz.

However, the prior synchronous DRAM including the internal column strobe generation circuit 60 having the above construction immediately interrupts the internal column strobe generation circuit to generate the internal column strobe signal which is corresponding to the input command in a low frequency, if the interrupt commands such as read, write and burst stop commands are received in the middle of the burst length set through the mode register set MRS in operation of the SDRAM. Therefore, the time that the burst signal ybstz becomes in a low state in high frequency is slow so that the internal column strobe signal is generated after the burst stop.

FIG. 4 is a timing diagram illustrating the above problem. Referring to FIG. 4, it is noted that the internal column strobe signal icasp6z is also generated after the burst stop in high frequency. From the timing diagram of FIG. 4, because the signal indicating the burst length stop is disabled in a low state and then the burst signal ybstz is disabled after the lapse of a constant time, the internal column strobe signal icasp6z of one clock is generated, after burst stop. Accordingly, the undesired internal column strobe signal icasp6z causes the malfunction of the SDRAM, thereby occurring the current consumption.

Besides, in the prior SDRAM, only the burst signal ybstz interrupts the internal column strobe signal icasp6z. According to this, the construction of the burst signal generation circuit which generate the burst signal in accordance with the interrupt commands becomes complicate and it is difficult to control the operation of the SDRAM with the interrupt command.

SUMMARY OF THE INVENTION

It is an object of the present invention to provide a synchronous semiconductor memory device for accurately interrupting an internal column strobe signal in a high and a low frequencies, when interrupt commands such as read, write and burst stop commands are received in the middle of a burst length set in a mode set register in operation of the synchronous semiconductor memory device.

According to an aspect of the present invention, there is provided to a synchronous semiconductor memory device, comprising: burst signal generation means for generating a burst signal for controlling generation of an internal column strobe signal; burst generation control means for controlling generation of the burst signal; burst length stop signal generation means for generating a burst length stop signal for controlling a length of the burst signal to the burst signal generation means; and internal column strobe generation means for directly receiving output signals of a buffer command which are not decoded to generate an interrupt in the middle of the burst signal and generating the internal column strobe signal by the burst signal.

In the synchronous semiconductor memory, the internal column strobe generation mean includes: a decoder stage for receiving the output signals from the command buffer to generate a decoded signal; a stabilization stage for delay for a constant time and latching the decoded signal from the decoder stage; a logic operation stage for carrying out a logic operation of the burst signal and an internal clock signal; and an output stage for carrying out a logic operation of output signals from the decoder stage, the stabilization stage and the logic operation stage to generate the internal column strobe signal.

The output signals of the command buffer is a chip select signal, a RAS bar signal, a CAS bar signal and a write enable bar signal.

In the synchronous semiconductor memory device, the stabilization stage includes: a latch for latching the output signal of the decoder stage; and inverters connected in series to an output of the latch.

In the synchronous semiconductor memory device, the logic operation stage includes: a NAND gate for receiving the burst signal and the internal clock signal; inverters of odd number connected in series between an output of the NAND gate and a first node; and inverters of even number connected in series between the first node and a second node.

In the synchronous semiconductor memory device, the output stage includes a NAND gate for receiving the output signals of the decoder stage, the stabilization stage and the logic operation stage and an inverter for inverting an output of the NAND gate to generate the internal column strobe signal.

BRIEF DESCRIPTION OF THE DRAWINGS

The objects and features of the invention may be understood with reference to the following detailed description of an illustrative embodiment of the invention, taken together with the accompanying drawings in which:

FIG. 5 is a block diagram of a synchronous memory device in accordance with an embodiment of the present invention;

DETAILED DESCRIPTION OF THE INVENTION

Figure 1:
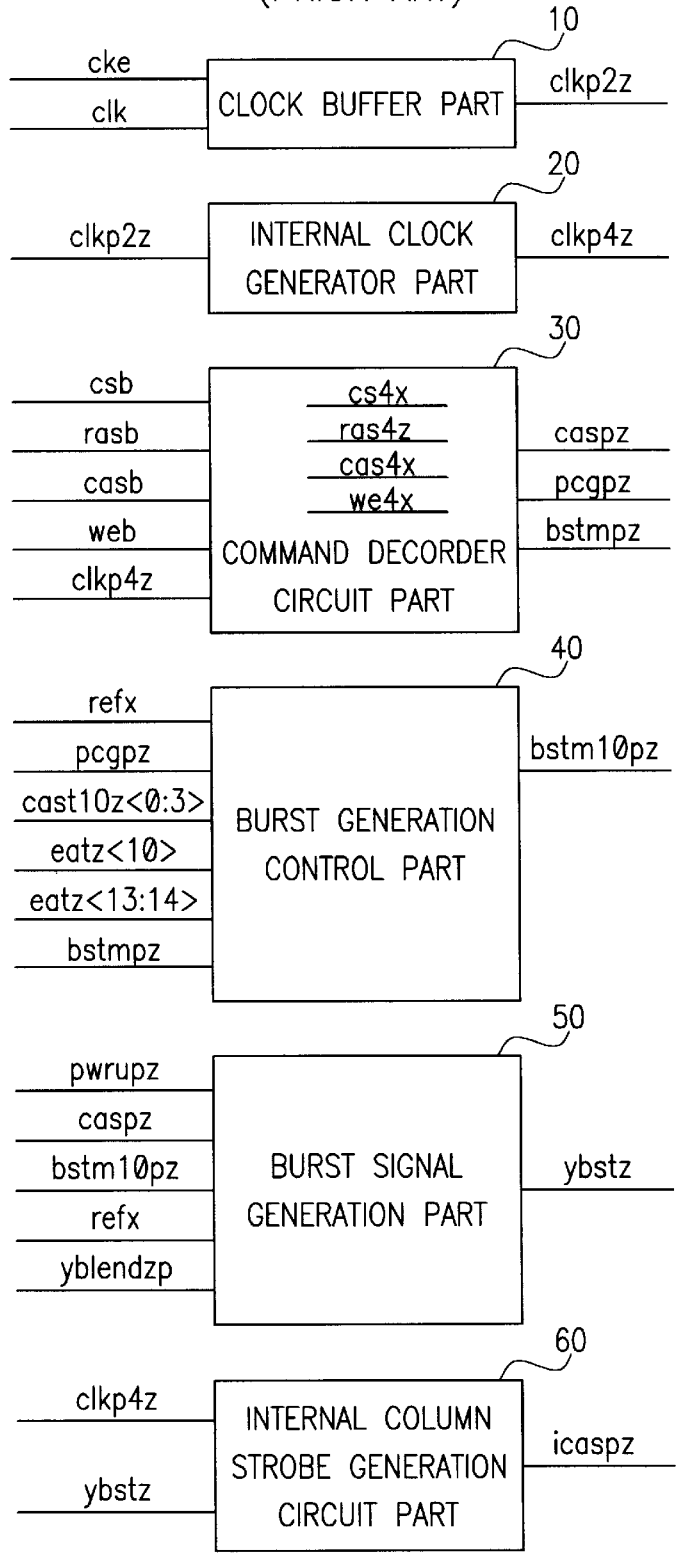
FIG. 1 is a block diagram of a synchronous semiconductor memory device for generating an internal column strobe signal in the prior art.
Figure 2:
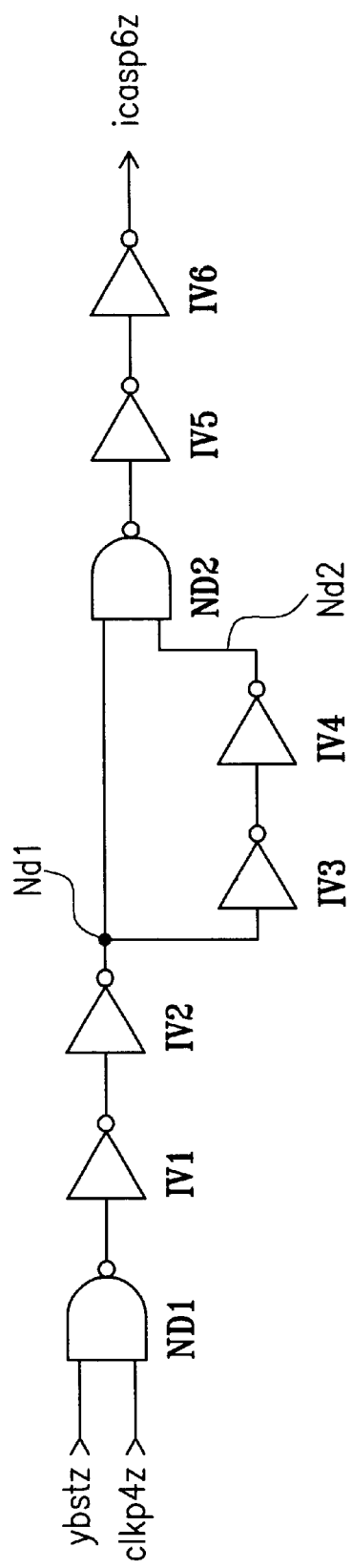
FIG. 2 is a circuit diagram of an internal column strobe generation circuit in FIG. 1.
Figure 3:
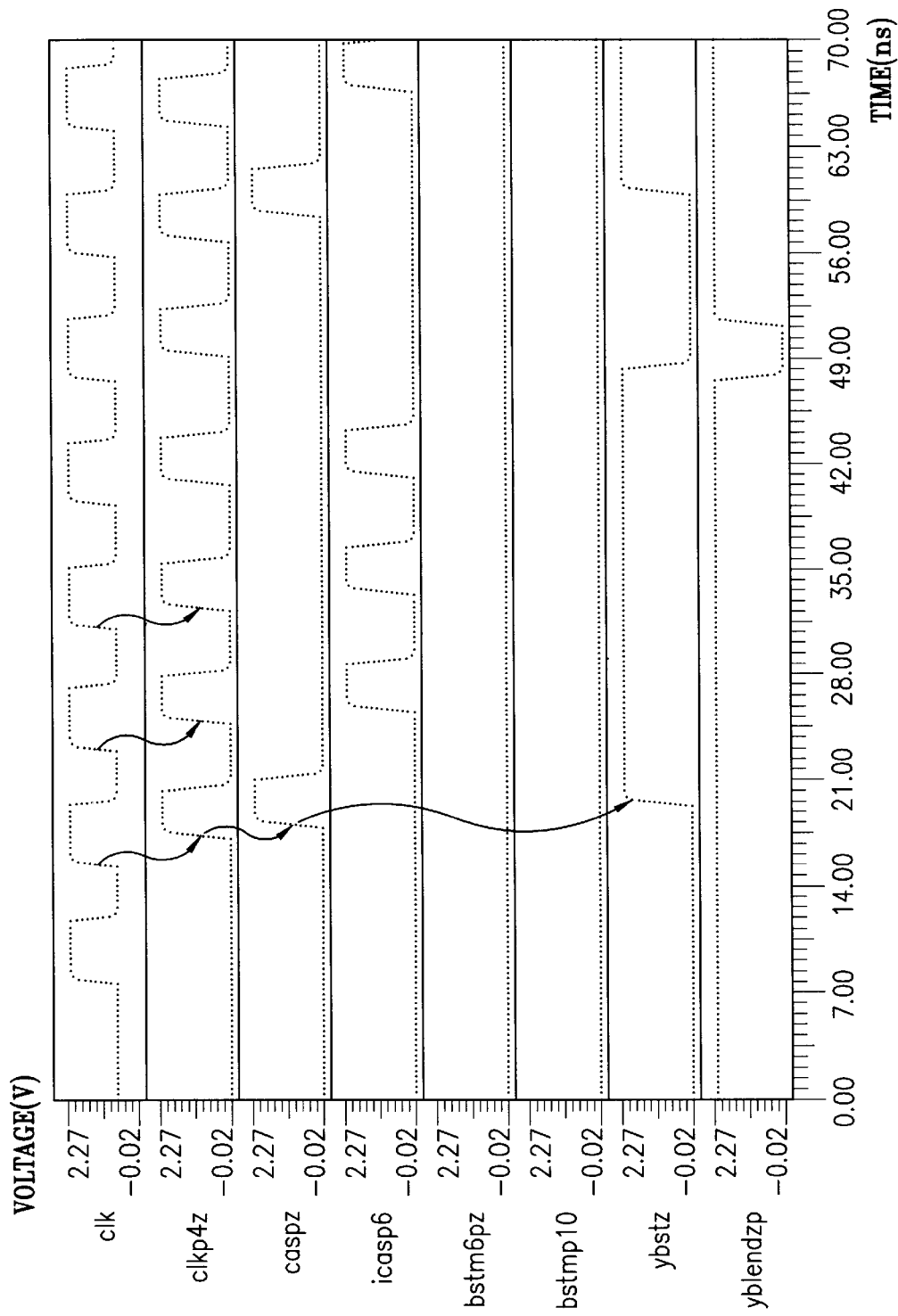
FIG. 3 is a timing diagram of the operation of the prior synchronous semiconductor memory in a high frequency range.
Figure 4:
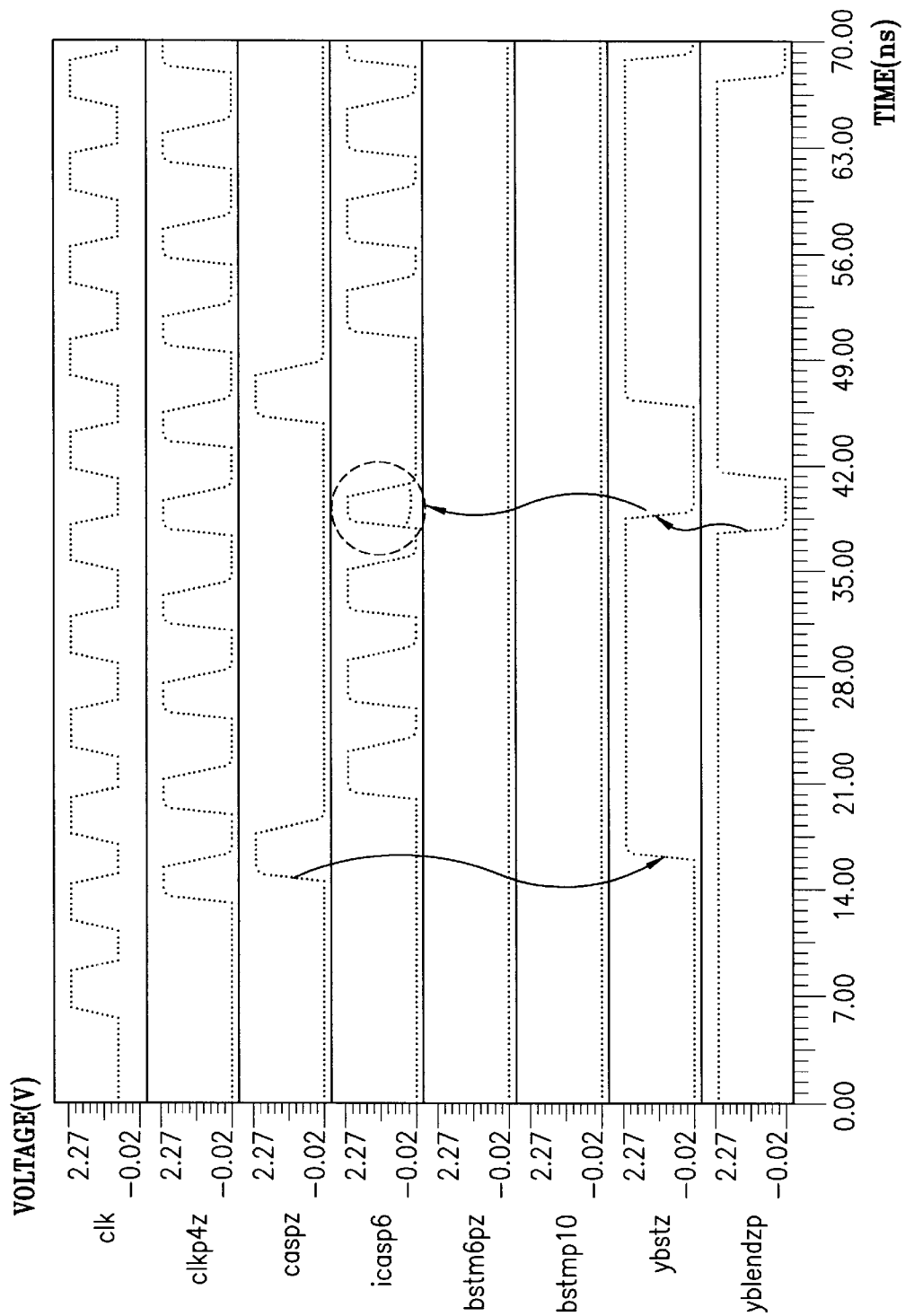
FIG. 4 is a timing diagram of the operation of the prior synchronous semiconductor device in a high frequency range.

FIG. 5 shows a block diagram of a synchronous semiconductor memory device in accordance with an embodiment of the present invention. The synchronous semiconductor memory device includes a clock buffer circuit 110, an internal clock generation circuit 120, a command decoder circuit 130, a burst generation control circuit 140, a burst signal generation circuit 150 and an internal column strobe generation circuit 160.

The clock buffer circuit 110 receives a clock enable signal cke and an external clock signal clk to generate an internal clock signal clkp2z. The internal clock signal generation circuit 120 receives the internal clock signal clkp2z from the clock buffer circuit 110 to generate another internal clock signal clkp4z.

The command decoder circuit 130 receives the internal clock signal clkp4z from the internal clock generation circuit 120 and external column strobe signals such as a chip select bar signal csb, a RAS bar signal rasb, a CAS bar signal casb, and a write enable bar signal web and decodes them to generate internal command signals caspz, pcgpz and bstmpz.

The burst generation control circuit 140 receives input signals refx, cast10z<0:3>, eatz<10> and eatz<13:14> and the internal command signals pcgpz and bstmpz from the command decoder circuit 130 to generate a burst generation control signal bstm10pz. The input signal refx is a signal which becomes in a low state, only when the synchronous DRAM is a refresh mode.

The burst signal generation circuit 150 receives a power-up signal pwrupz, the internal command signal caspz from the command decoder circuit 130, the burst generation control signal bstm10pz from the burst generation control circuit 140 and input signals refx and a burst length stop signal yblendzp to generate a burst signal ybstz. Herein, the input signal yblendzp is the burst length stop signal which is disabled in a low state, when the burst length is stopped.

The internal column strobe generation circuit 160 receives the external column strobe signals such as the chip select bar signal csb, the RAS bar signal rasb, the CAS bar signal casb, and the write enable bar signal web, the internal clock signal clkp4z from the internal clock generation circuit 120 and the burst signal ybstz from the burst signal generation circuit 150 to generate an internal column strobe signal icaspz.

The synchronous semiconductor memory device further includes a burst length stop signal generation circuit for generating the burst length stop signal yblendzp indicating that the burst operation is stopped, which is not shown in FIG. 5.

Figure 6:
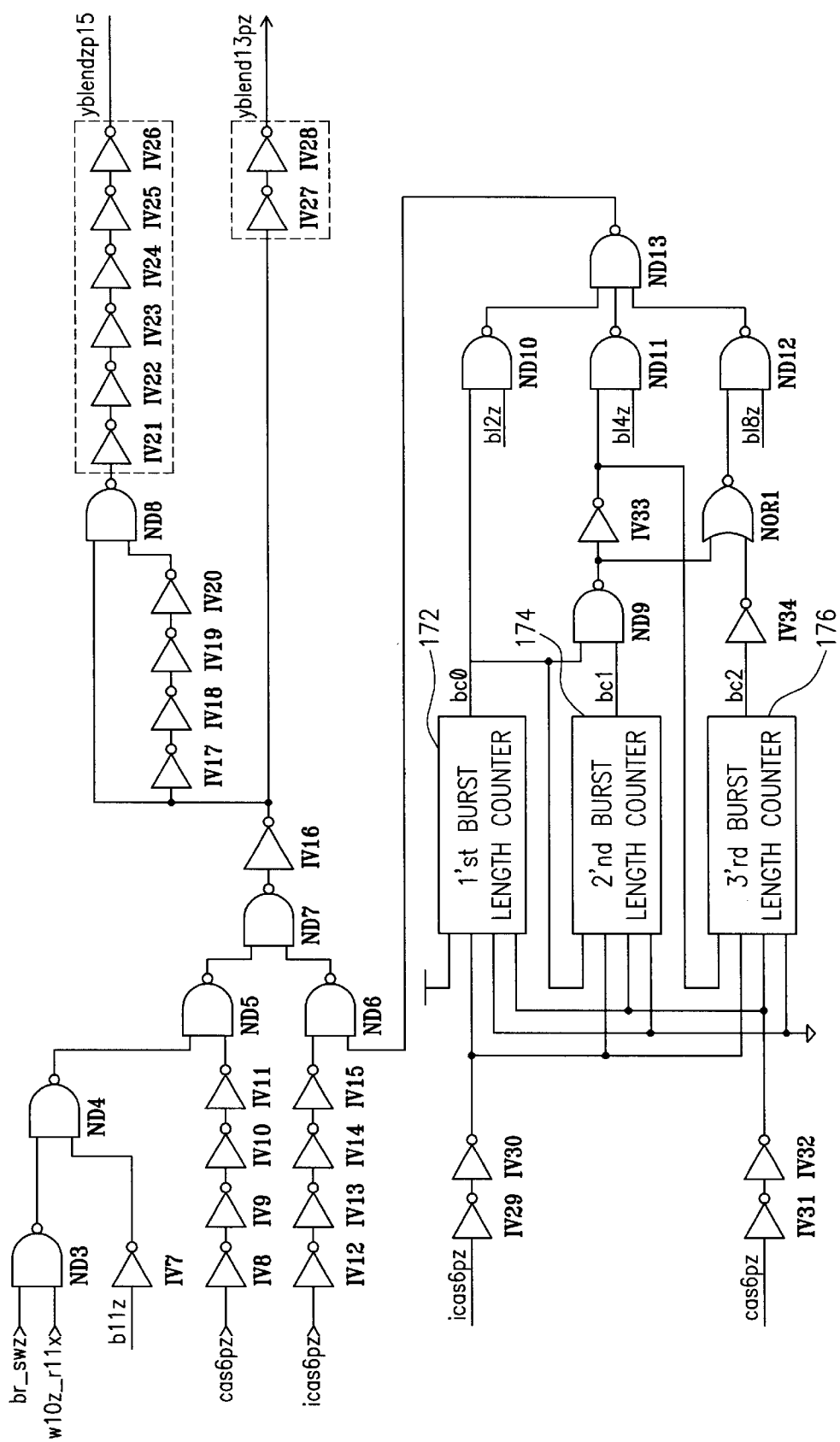
FIG. 6 is a circuit diagram of a burst length stop signal generation circuit of the present invention.

FIG. 6 show the burst length stop signal generation circuit. The burst length stop signal generation circuit includes a first burst length counter 172 which receives the internal column strobe signal icas6pz from the internal column strobe generation circuit 160 and the external column strobe signal cas6pz to count the burst length; a second burst length counter 174 which receives an output signal bc0 from the first burst length counter 172 and the internal column strobe signal icas6pz and the external column strobe signal cas6pz to count the burst length; a NAND gate ND9 and an inverter IV33 which carry out an AND logic operation of the output signal bc0 from the first burst length counter 172 and an output signal bc1 from the second burst length counter 174; and a third burst length counter 176 which receives an output signal of the inverter IV33 and internal column strobe signal icas6pz and the external column strobe signal cas6pz to count the burst length.

The burst length stop signal generation circuit further includes an inverter IV34 for inverting an output signal bc2 of the third burst length counter 176; a NOR gate for receiving an output signal of the NAND gate ND9 and an output signal of the inverter IV34; a NAND gate ND10 for receiving the output signal bc0 of the first burst length counter 172 and a burst length signal b12z; a NAND gate ND11 for receiving the output signal of the inverter IV33 and a burst length signal b14z; a NAND gate ND12 for receiving an output signal of the NOR gate NOR1 and a burst length signal b18z; and a NAND gate ND13 for receiving output signals of the NAND gates ND10–ND12.

The burst length stop signal generation circuit further includes a NAND gate ND3 for receiving input signals br_swz and w10z_r11x; an inverter IN7 for inverting a burst length signal b11z; a NAND gate ND4 for receiving output signals of the NAND gate ND3 and the inverter IV7. The burst length stop signal generation circuit further includes inverters IV8–IV11 connected in series for delaying the external column strobe signal cas6pz for a constant time; inverters IV12–IV15 connected in series for delaying the internal column strobe signal icas6pz for a constant time; a NAND gate ND5 for receiving output signals of the NAND gate ND4 and the inverter IV11; a NAND gate ND6 for receiving output signals of the NAND gate ND13 and the inverter IV15; a NAND gate ND7 for receiving output signals of the NAND gates ND5 and ND6; and an inverter IV16 for inverting an output signal of the NAND gate ND7.

The burst length stop signal generation circuit further includes inverters IV17–IV20 connected in series for delaying an output of the inverter IV16 for a constant time; a NAND gate ND8 for receiving output signals of the inverters IV16 and IV20; inverters IV21–IV26 connected in series for receiving an output signal of the NAND gate ND8 to generate the burst length stop signal yblendzp15; and inverters IV27–IV28 connected in series for receiving the output signal of the inverter IV16 to generate another burst length stop signal yblend13pz.

The burst length stop signal generation circuit having the above construction receives the external column strobe signal cas6pz and the internal column strobe signal icas6pz from the internal column strobe generation circuit 160 to generate the burst length stop signal indicating the stop of the burst command. At this time, the burst length stop signal has a low level and the burst signal ybstz is disabled by the burst length stop signal to control the generation of the internal column strobe signal icasp6pz.

As shown in FIG. 6, when the internal column strobe signal icas6pz and the output signal of the NAND gate ND13 are high levels, the output signal of the NAND gate ND6 becomes a low state and the burst length stop signal yblend13pz=yblendzp15 becomes a low level.

Figure 7:
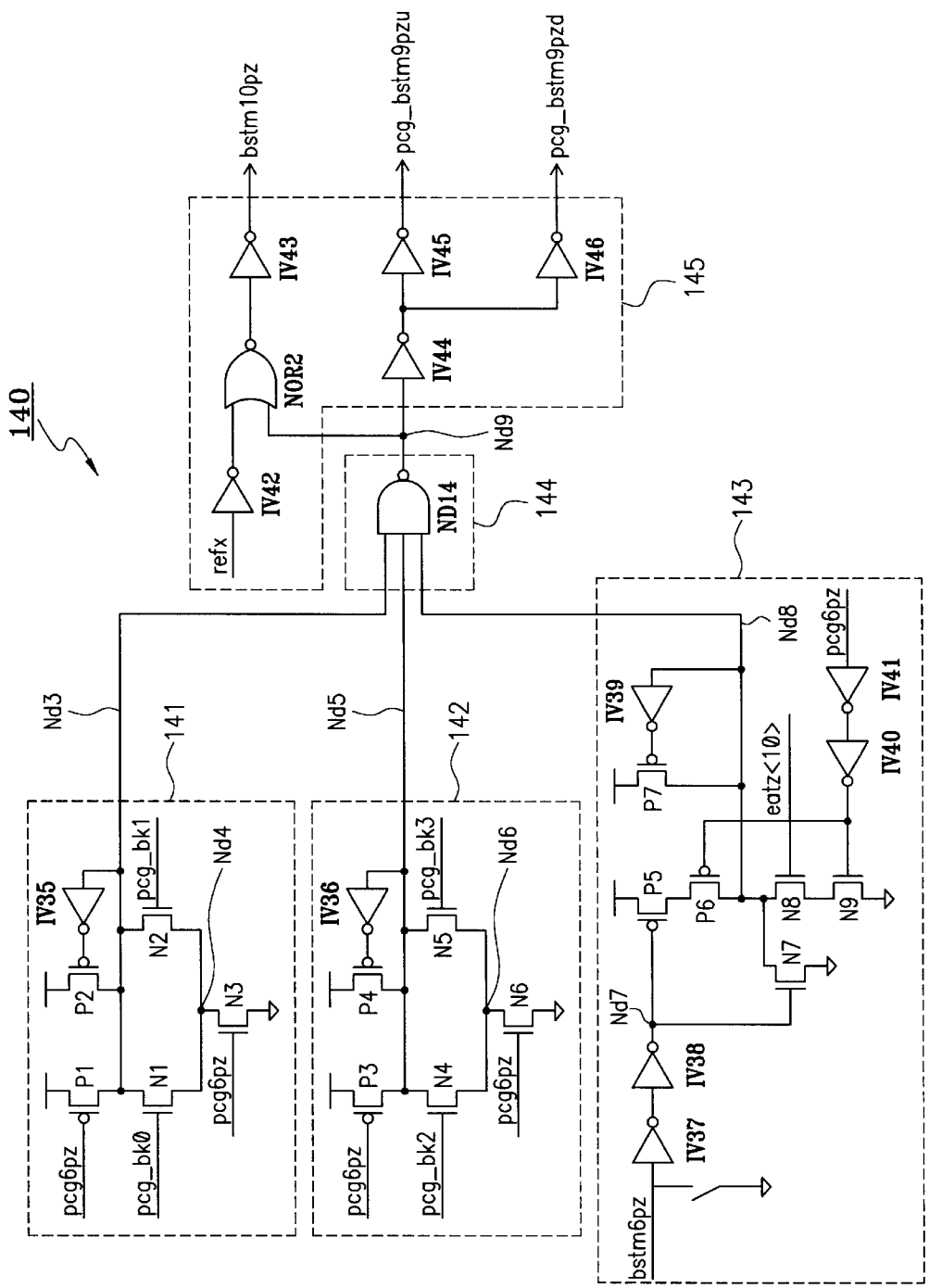
FIG. 7 is a circuit diagram of a burst generation control circuit in FIG. 5.

FIG. 7 shows the burst generation control circuit 140. AS shown in FIG. 7, the burst generation control circuit 140 includes a first differential amplifying stage 141 for differential-amplifying two input signals pcg_bk0 and pcg_bk1 by a bank information signal pcg6pz; a second differential amplifying stage 142 for differential-amplifying two input signals pcg_bk2 and pcg_bk3 by the bank information signal pcg6pz.

The burst generation control signal 140 further includes a first logic operation stage 143 for generating an logic operation signal of the input signals bstm6pz, eatz<10> and pcg6pz; a second logic operation stage 144 for carrying out a NAND logic operation of output signals Nd3 and Nd5 of the first and second differential amplifying stages 141 and 142 and an output signal Nd8 of the first logic operation stage 143; and an output stage 145 for receiving the input signal refx and an output signal Nd9 of the second logic operation stage 144 to generate a burst generation control signal bstm10pz and for delaying and inverting the output signal Nd9 of the second logic operation stage 144 to generate output signals pcg_bstm9pzu and pcg_bstm9pzd.

The first differential amplifying stage 141 includes a PMOS transistor P1 for supplying a power voltage Vcc to the output node Nd3 by the bank information signal pcg6pz; NMOS transistors N1 and N2 connected in parallel where the input signals pcg_bk0 and pcg_bk1 are provided to gates; a NMOS transistor N3 for making a node Nd4 to a ground voltage Vss by the bank information signal pcg6pz and a PMOS transistor P2 which supplies the power voltage Vcc to the node Nd3 and the output signal Nd3 is provided to its gate through an inverter IV35.

A second differential amplifying stage 142 includes a PMOS transistor P3 for supplying the power voltage Vcc to the output node Nd5 by the bank information signal pcg6pz; NMOS transistors N4 and N5 connected in parallel where the input signals pcg_bk2 and pcg_bk3 are provided to gates; a NMOS transistor N6 for making a node Nd6 to the ground voltage Vss by the bank information signal pcg6pz and a PMOS transistor P4 which supplies the power voltage Vcc to the node Nd5 and the output signal Nd5 is provided to its gate through an inverter IV36.

The first logic operation stage 143 includes inverters IV37 and IV38 connected in series for delaying the input signal bstm6pz for a constant time and providing the delayed input signal to a node Nd7; inverters IV40 and IV41 connected in series for delaying the bank information signal pcg6pz for a constant time; PMOS transistors P5 and P6 connected in series which are respectively switched by output signals of the inverters IV38 and IV40 to supply the power voltage Vcc to the node Nd8.

The first logic operation stage 143 further includes a NMOS transistor N7 for making the node Nd8 to the ground voltage Vss by the output signal of the inverter IV38 at the node Nd7; NMOS transistors N8 and N9 connected in series which are switched by the input signal eatz<10> and the output signal of the inverter IV40 to make the node Nd8 to the ground voltage Vss; and a PMOS transistor P7 which supplies the power voltage Vcc to the node Nd8 and the potential of the node Nd8 is provided to its gate through an inverter IV39.

The second logic operation stage 144 includes a NAND gate ND14 for receiving the output signals Nd3, Nd5 and Nd8 from the first and second differential amplifying stages 141 and 142 and the first logic operation stage 143.

The output stage 145 includes an inverter IV42 for inverting the input signal refx; a NOR gate NOR2 for receiving an output signal of the inverter IV42 and the output signal Nd9 of the second logic operation stage 144; an inverter for inverting an output of the NOR gate NOR2 to generate the burst generation control signal bstm10pz; inverters IV44 and IV45 connected in series for receiving the output signal Nd9 of the second logic operation stage 144 to generate the output signal pcg_bstm9pzu; and an inverter IV46 for inverting an output signal of the inverter IV44 to generate the output signal pcg_bstm9pzd.

Figure 8:
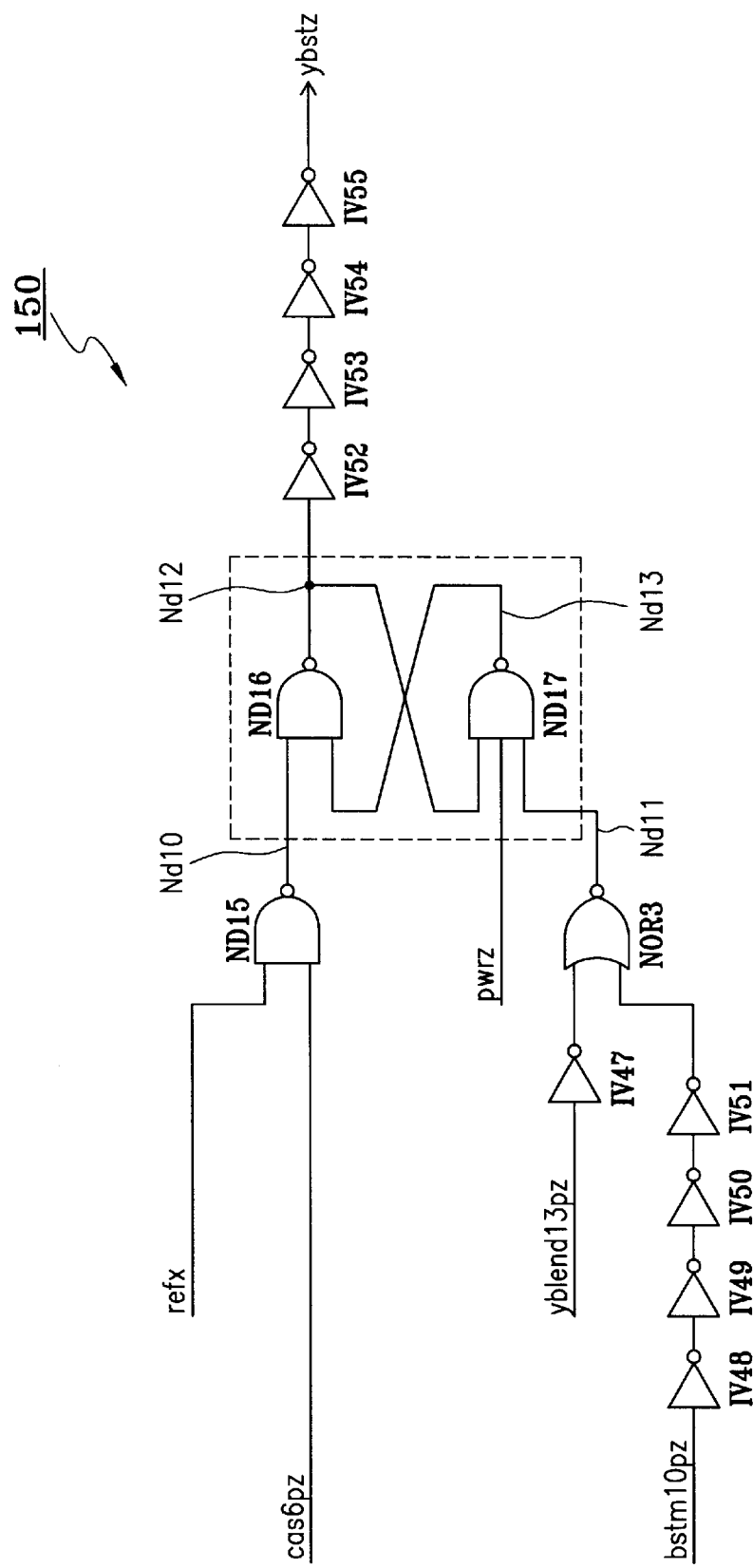
FIG. 8 is a circuit diagram of a burst signal generation circuit in FIG. 5.

FIG. 8 shows the burst signal generation circuit 150. The burst signal generation circuit 150 includes a NAND gate ND15 for receiving the input signals refx and cas6pz; an inverter IV47 for inverting the output signal yblend13pz of the burst length stop signal generation circuit in FIG. 6;

inverters IV48–IV51 connected in series for delaying the burst generation control signal bstm10pz for a constant time; a NOR gate for receiving output signals of the inverters IV47 and IV51; a NAND gate ND16 for receiving an output signal Nd10 of the NAND gate ND15 and an output signal Nd13 of a NAND gate ND17; the NAND gate ND17 for receiving an output signal Nd12 of the NAND gate ND16, an input signal pwrz and an output signal Nd11 of the NOR gate NOR3; inverters IV52–IV55 connected in series for delaying the output signal Nd12 of the NAND gate Nd16 to generate the burst signal ybstz.

The burst signal generation circuit 150 having the above construction generates the burst signal ybstz, when the column strobe signal casp6pz is enabled in a high state. The generation of the burst signal ybstz is controlled, when the burst length stop signal yblend13pz is disabled in a low state.

Figure 9:
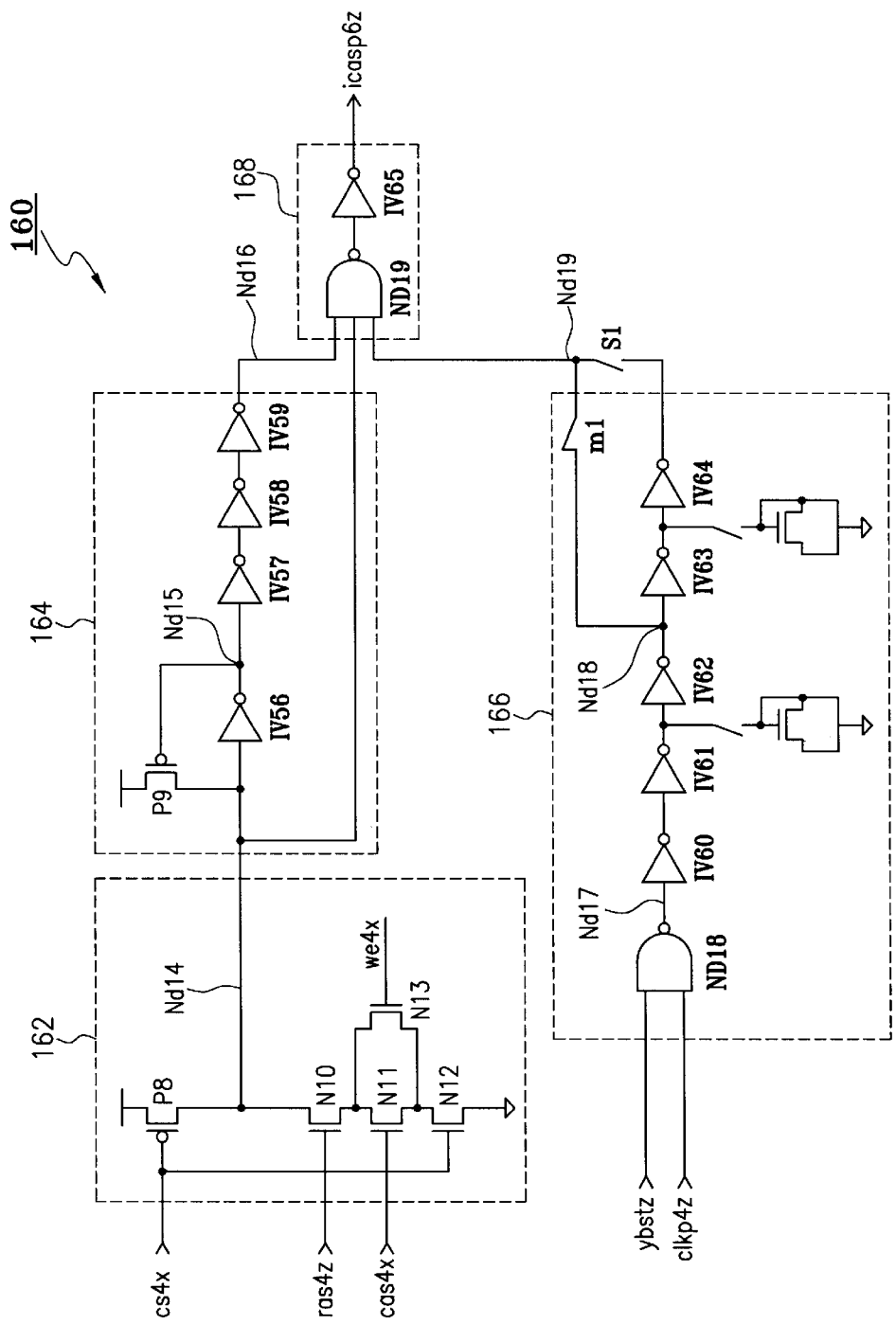
FIG. 9 is a circuit diagram of an internal column strobe generation circuit in FIG. 5.

FIG. 9 shows the internal column strobe generation circuit 160. As shown in FIG. 9, the internal column strobe generation circuit 160 includes a decoder stage 162 for decoding an operation comnand signals cs4x, ras4z, cas4x and we4x received from an exterior, a stabilization stage for stabilizing an output Nd14 of the decoder stage 162; a logic operation stage 166 for carry out a logic operation of the internal clock signal clkp4z and the burst signal ybstz; and an output stage 168 for carrying out a logic operation of output signals Nd16 and Nd19 of the stabilization stage 164 and the logic operation stage 166 to generate the internal column strobe signal icasp6z.

The decoder stage 162 includes a PMOS transistor P8 for supplying the power voltage Vcc to the node Nd14 by the chip select signal cs4x; NMOS transistors N10–N12 which are connected in series between the node Nd14 and the ground voltage Vss and are respectively switched by the RAS signal ras4z, a CAS signal cas4x and the chip select signal cs4x in sequence; and a NMOS transistor N13 which is connected in parallel to the NMOS transistor N11 and is switched by the write enable signal we4x.

The stabilization stage 164 includes an inverter IV56 connected between the node Nd14 and a node Nd15; a PMOS transistor P9 for supplying the power voltage Vcc to the node Nd14 by the output signal Nd15 of the inverter IV56; and inverters IV57–IV59 connected in series for delaying the output signal Nd15 of the inverter IV56 for a constant time.

The logic operation stage 166 includes a NAND gate ND18 for receiving the internal clock signal clkp4z from the internal clock generation circuit 120 and the burst signal ybstz from the burst signal generation circuit 150; inverters IV60–IV62 connected in series for inverting and delaying an output signal Nd17 of the NAND gate ND18 for a constant time; inverters IV63 and IV64 connected in series for delaying an output signal Nd18 of the inverter IV62 for a constant time; a switch S1 connected between an output of the inverter IV64 and a node Nd19; and a metal fuse m1 connected between the node Nd18 and the node Nd19.

The output stage 168 includes a NAND gate ND19 for receiving an output signal Nd16 of the stabilization stage Nd16 and the output signal Nd14 of the decoder stage 162 and the output signal Nd19 of the logic operation stage 166 to generate the internal column strobe signal icasp6z.

The internal column strobe generation circuit 160 having the above construction generates the internal column strobe signal icasp6z with synchronization to the internal clock signal clkp4z, after the burst signal ybstz is enabled. If the burst signal ybstz is disabled, the generation of the internal column strobe signal icasp6z is stopped. The operation command signals cs4x, ras4x, cas4x, we4x which are provided to the internal column strobe generation circuit 160 have the values which are obtained through the values of the external control commands /CS, /RAS, /CAS, and /WE in column strobe interrupt commands such as burst stop operation, read operation, read operation having self precharge function, write operation, and write operation having self precharge function.

In the read operation, the write operation and the burst stop operation, the values of the external control commands /CS, /RAS, /CAS and /WE are listed in the following table I.

TABLE I

|  | /CS | /RAS | /CAS | /WE |
| --- | --- | --- | --- | --- |
| READ | L | H | L | H |
| WRITE | L | H | L | L |
| BURST STOP | L | H | H | L |

Figure 10:
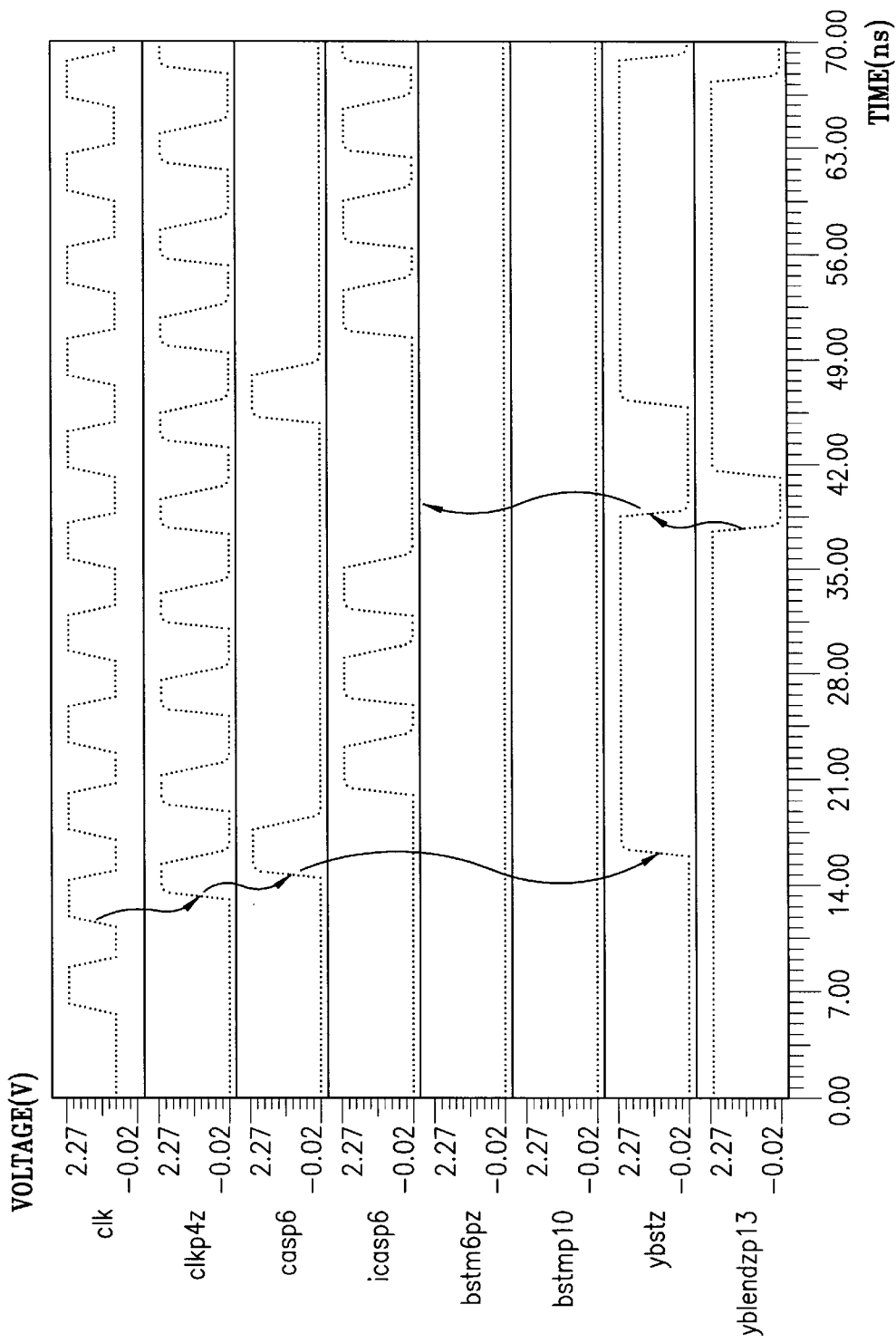
FIG. 10 is a timing diagram of the present invention.

The operation of the synchronous semiconductor memory device will be described with reference to the timing diagram of FIG. 10. First, a command buffer (not shown) generates the internal command signal cs4x, ras4x, cas4x and we4x by an external control command signal and the operation function of the synchronous semiconductor memory device is determined by the decoding signal of the internal command signals cs4x, ras4x, cas4x and we4x.

If the external column strobe commands such as read operation, write operation, read operation having self precharge function and write operation having self precharge function are received, the command decoder circuit 130 decodes the internal command from the command buffer to generate the external column strobe enable signal caspz=cas6pz which is provided to the burst signal generation circuit 150.

As shown in FIG. 8, in the burst signal generation circuit 150, the NAND gate ND15 receives the external column strobe enable signal caspz=casp6z of high state and the refresh operation signal refx of the high state and generates the output signal Nd 10 of low state. Herein, the refresh operation signal refx has a low level only when the synchronous semiconductor memory device is a refresh mode.

On the other hand, the flip flop constituted by the NAND gates ND16 and ND17 which latches the output signal Nd10 of the NAND gate ND15 generates the output signals Nd12 of high state by the output signal Nd10 of low state from the NAND gate ND15. Accordingly, the burst signal generation circuit 150 generates the burst signal ybstz of high state.

That is, when the external column strobe signal caspz becomes a high state, the burst signal generation circuit 150 generates the burst signal ybstz of high state. The burst signal ybstz is transited to a low state, in case where the burst length stop signal yblend13pz=yblendzp15 generated from the burst length stop signal generation circuit 150 is transited to a low state or in case where the burst generation control signal bstm10pz generated from the burst generation control circuit 140 is transited to a high state. Herein, the burst generation control signal bstm10pz is a high state, when the external control command is the burst stop command or the precharge command.

The control operation of the internal column strobe signal icasp6z by the burst length stop signal yblendzp13 will be described with reference to the timing diagram of FIG. 10. The internal column strobe signal icasp6z is generated with synchronization to the internal clock signal clkp4z, after the burst signal ybstz is enabled by the external column strobe signal casp6z. Thereafter, if the burst length stop signal yblendzp13 becomes disabled in a low state, the burst signal is disabled in a low level by the burst length stop signal yblendzp13. At this time, the generation of the internal column strobe signal icasp6z is constrained by the burst signal ybstz which is disabled in a low state.

Figure 11:
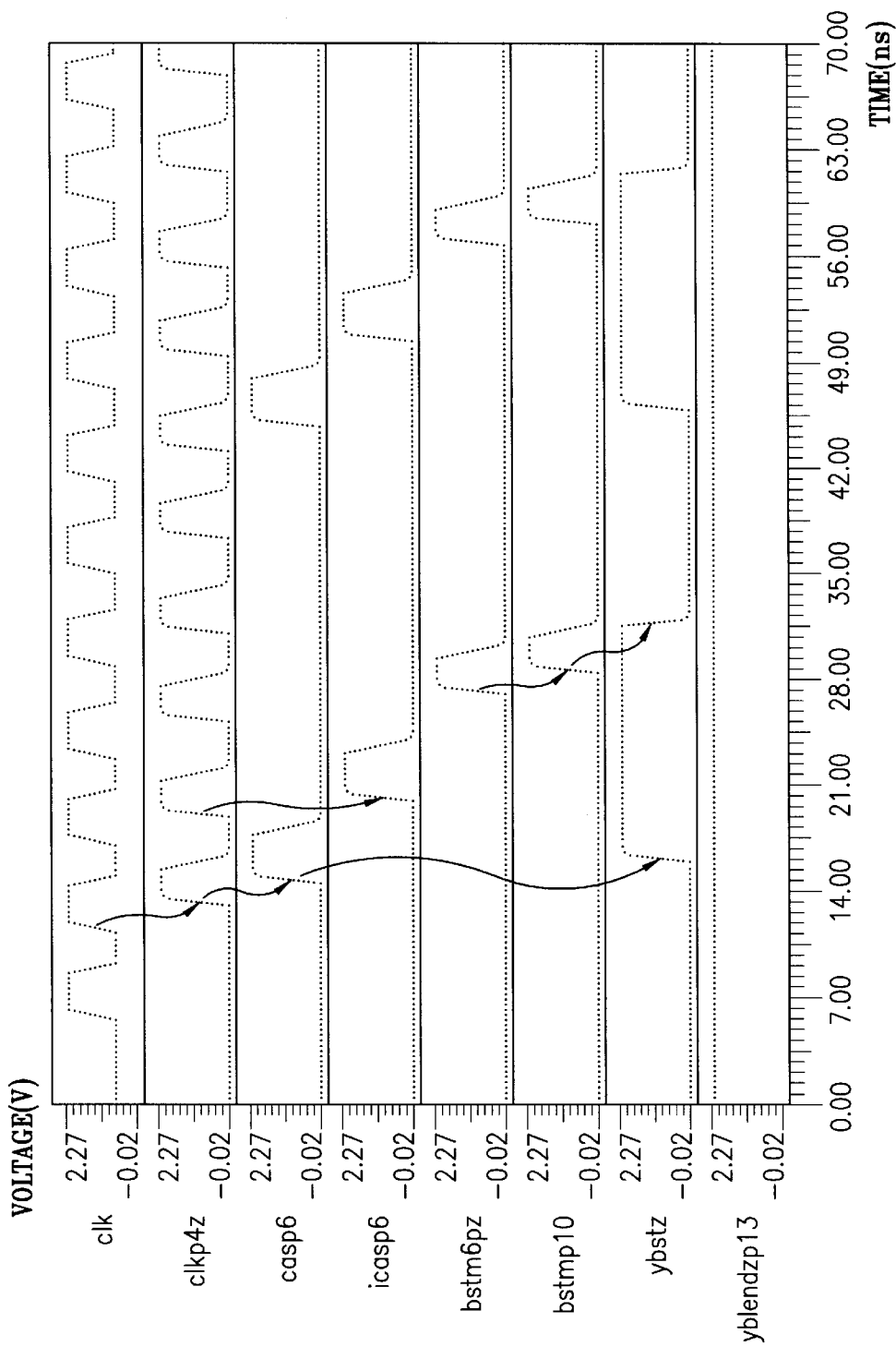
FIG. 11 is another timing diagram of the present invention.

The control operation of the internal column strobe signal icasp6z by the burst generation control signal bstmp10 will be described with reference to the timing diagram of FIG. 11. After the burst signal generation circuit 150 receives the external column strobe signal casp6z to generate the burst signal ybstz of high state, the internal column strobe signal icasp6z is enabled in a high stage in the following clock pulse clkp4z. Thereafter, if the burst stop command is received in the external clock clk, the output signals cs4x, ras4z, cas4x, and we4x from the internal command buffer is decoded to generate the decoded signal bstm6pz. The burst generation control circuit 140 generates the output signal, i.e. the burst generation control signal bstm10pz of high state by the signal bstm6pz. The burst generation control signal bstm10pz is provided to the burst signal generation circuit 150. The burst signal generation circuit 150 generates the output signal ybstz which is disabled in a low state by the burst generation control signal bstm10pz which is enabled in a high state and controls the operation of the internal column strobe generation circuit 150, thereby controlling the generation of the internal column strobe signal icasp6z.

Accordingly, after normal burst length, it makes the burst signal ybstz to be disabled in a low state by the burst length stop signal yblend13pz=yblendzp13 or the burst generation control signal bstm10pz and it is possible to forbid the internal column strobe signal icaspz to generate.

According to the present invention, if the interrupt command is received in the middle of the burst length set through the mode register set MRS in the operation of the synchronous semiconductor memory device, the synchronous semiconductor memory device generates the internal column strobe signal corresponding to the internal command with synchronization to the internal clock signal following the burst signal and forbids the internal column strobe signal to generate by the burst length stop signal, thereby accurately making the interrupt in a low and a high frequency ranges.

Besides, the output signals of the command buffer except the prior burst signal is directly provided as an input signal of the internal column strobe generation circuit which generates the internal column strobe signal to generate the interrupt without decoding, thereby increasing the operation speed and constituting the circuit with simplification. That is, in the prior memory device, the burst signal generation circuit is complicate, because only the burst signal is exist as the interrupt signal for interrupting the internal column strobe signal. However, in this invention, the internal column strobe signal is interrupted by the output signal of the command buffer and the additional construction of the device becomes reduced, thereby improving the operation speed and reducing the current consumption.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A circuit for generating internal column strobe signal in a synchronous semiconductor memory device, comprising:
    a clock buffer part for buffering an external clock signal to generate a first internal clock signal;
    an internal clock generation part for receiving the first internal clock signal to generate a second internal clock signal;
    a command decoder part for periodically generating an external column strobe enable signal synchronized to the second internal clock signal by a chip select bar signal, a row address strobe bar signal, a column address strobe bar signal and a write enable bar signal;
    a burst signal generation part for a burst signal generated by the external column strobe enable signal and disabled by a burst length stop signal; and
    an internal column strobe generation part being controlled by the chip select bar signal, the row address bar signal, the column address bar signal, and the write enable bar signal, for generating an internal column strobe signal synchronized to the second internal clock signal inputted after the burst signal is enabled, and for stopping the generation of the internal column strobe signal by the disablement of the burst signal.

2. The circuit as claimed in claim 1, wherein the internal column strobe generation part includes:
    a decoder stage for outputting a signal combined by the chip select bar signal, the row address bar signal, the column address bar signal, and the write enable bar signal;
    a stabilization stage for delaying or latching an output signal from the decoder stage for a predetermined time;
    a logic operation part for AND operating of the burst signal and the second internal clock signal, and
    an output part for AND operating output signals from the decoder stage, the stabilization stage and the logic operation part to generate an internal column strobe signal.

3. The circuit as claimed in claim 2, wherein the decoder stage comprises:
    a first PMOS transistor for transmitting source to a first node as an output terminal according to the chip select bar signal;
    a first to a third NMOS transistors connected in series between the first node and a ground and controlled by row address bar signal, the column address bar signal, and the chip select bar signal; and
    a fourth NMOS transistor connected in a parallel to the second NMOS transistor and controlled by the write enable bar signal.

4. The circuit as claimed in claim 3, wherein the stabilization stage includes:
    a first inverter connected between the first node and a second node;
    a second PMOS transistor for transmitting source voltage to the first node according to the signal from the second node; and
    a second to a fourth inverters connected in series between the second node and a third node as an output terminal.

5. The circuit as claimed in claim 2, wherein the logic operation part includes:
    a first NAND gate for NAND operating the burst signal and the second internal clock signal;
    a fifth to a ninth inverters connected in series between an output terminal of the first NAND gate and a fourth node as an output terminal;

a first switch and a fifth NMOS transistor connected in series between the output terminal of the sixth inverter and ground voltage, the fifth NMOS transistor having diode structure;

a second switch and a sixth NMOS transistor connected between the output terminal of the eight inverter and ground voltage, the sixth NMOS transistor having diode structure;

a metal fuse connected between the output terminal of the seventh inverter and the fourth node; and a third switch connected between the output terminal of the ninth inverter and the fourth node.

6. The circuit as claimed in claim 2, wherein the output part comprises a NAND gate and an inverter.

* * * * *